US006480408B1

(12) United States Patent
Shirley

(10) Patent No.: US 6,480,408 B1
(45) Date of Patent: Nov. 12, 2002

(54) TWISTED GLOBAL COLUMN DECODER

(75) Inventor: Brian M. Shirley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/583,439

(22) Filed: May 31, 2000

Related U.S. Application Data

(62) Division of application No. 09/362,076, filed on Jul. 27, 1999, now Pat. No. 6,111,774, which is a continuation of application No. 09/026,603, filed on Feb. 20, 1998, now Pat. No. 5,949,698.

(30) Foreign Application Priority Data

Jun. 18, 1999 (JP) .......................................... 11-173326

(51) Int. Cl.[7] ................................................. G11C 5/02
(52) U.S. Cl. ........................................... 365/51; 365/69
(58) Field of Search .............................. 365/51, 52, 53, 365/69, 68, 190

(56) References Cited

U.S. PATENT DOCUMENTS

| 4,914,502 A | 4/1990 | Lebowitz et al. ............. 357/68 |
|---|---|---|
| 5,091,887 A | 2/1992 | Asakura ...................... 365/206 |
| 5,287,322 A | 2/1994 | Rastegar ................. 365/230.05 |
| 5,534,732 A | 7/1996 | DeBrosse et al. ........... 257/776 |
| 5,732,010 A | 3/1998 | Takashima et al. ........... 365/63 |
| 6,249,452 B1 * | 6/2001 | Scott ........................... 365/69 |
| 6,259,621 B1 * | 7/2001 | Li et al. ....................... 365/69 |
| 6,320,781 B1 * | 11/2001 | Li et al. ....................... 365/69 |

* cited by examiner

Primary Examiner—Richard Elms
Assistant Examiner—Anh Phung
(74) Attorney, Agent, or Firm—Schwegman, Lundberg, Woessner & Kluth, P.A.

(57) ABSTRACT

Adjacent global column decode lines in a dynamic random access memory (DRAM) are twisted in combination with a complex twist of digit lines such that one global column decoder line provides access to four non-adjacent digit line pairs. The four non-adjacent digit pairs are routed to external pins, allowing data from each of the pairs to be read or written simultaneously. Further, I/O switches which are located between the twisted global column decoder lines are coupled to outside pairs of the twisted digit lines, and the I/O switches which are located outside the twisted global column decoder lines are coupled to inside ones of the complex twisted digit lines.

32 Claims, 4 Drawing Sheets

TWISTED GLOBAL COLUMN DECODER

This application is a divisional of U.S. Ser. No. 09/362,076, filed Jul. 27, 1999 now U.S. Pat. No. 6,111,774 issued on Aug. 28, 2001 which is a continuation of U. S. Ser. No. 09/026,603, filed Feb. 20, 1998, now U.S. Pat. No. 5,949,698.

FIELD OF THE INVENTION

The present invention relates to semiconductor based memory devices, and in particular to column decoder line routing in semiconductor based memory devices.

BACKGROUND OF THE INVENTION

Semiconductor memory devices are becoming more and more complex as their size decreases and their storage density increases. To help handle some of the increase in storage density, an architecture comprising multiple subarrays of memory cells on a die for storing values such as bits, has been adopted in dynamic random access memory (DRAM) devices. Each of the subarrays comprises multiple rows of memory cells that are accessed or "fired" by activation of row address signals. Each memory cell in a row in a subarray is coupled via a digit line to its own set of interleaved sense amplifiers which provide the bits to pairs of I/O lines 112, 114, 116 and 118, as shown in prior art FIG. 1. FIG. 1 is an example of a complex twist digit line scheme which helps to reduce coupling terms from each digit line to other digit lines. Each digit line twist occupies valuable silicon area, so efficient twist schemes must be utilized. Column decoder lines 120 and 122 run over a block of memory cells on metal, and connect to I/O switches 124 which enable the sense amplifier to provide a bit or digit sensed and amplified from the digit lines to the I/O lines, Due to layout considerations, a global column decode or coldec line usually allows for two digits in every interleaved sense amplifier block to connect to the I/O lines. Thus, one global column decoder line going high allows four adjacent digits or bits of data to be switched onto four I/O line pairs as seen in prior art FIG. 1.

This type of architecture has been very helpful in obtaining DRAMs beyond the 16 MB generation. However, one global column decoder line going high allows four adjacent digits to be switched onto four I/O line pairs. Note that no other global coldec line can go high along these I/O lines, since this would short together digit pairs through the I/O switches. In this conventional scheme, it is often desired to take these four active bits of data to individual external output pins referred to as DQ pins, allowing each bit to be read or written simultaneously. Because neighboring digits are very capacitively coupled to each other due to their close proximity, writing these four adjacent pairs simultaneously can lead to poor write times. Furthermore, since every combination among the four digits must be tested for proper operation, significant time and complexity is added to testing.

In the past, these problems have often meant that only two of the four I/O lines are simultaneously routed to DQ pins, and these two are further chosen to be two nonadjacent digit lines. Thus, I/O pairs 112 and 116 would be simultaneously active, while I/O pairs 114 and 118 were ignored. The opposite is true when 114 and 118 are active, 112 and 116 are ignored. This solves the write problem, but means that another two bits of data must be taken from another array on the die, which adds to die operating current, size, and complexity, all of which adversely affect cost.

There is a need for increasing the number of simultaneous I/O lines which can be output from a memory array. There is a need for this number to be increased without adding to die operating current, size or complexity. There is a further need to cut down on the time, complexity and expense of testing DRAMs.

SUMMARY OF THE INVENTION

Adjacent global column decode lines in a dynamic random access memory (DRAM) array having twisted digit lines are twisted such that one global column decoder line provides access to four non-adjacent digit line pairs. The four non-adjacent digit pairs are routed to external pins, allowing data from each of the pairs to be read or written simultaneously. In one embodiment, selected pairs of digit lines are selectively twisted from inside to outside to ensure that digit lines from different memory cells in the DRAM are non-adjacent.

In a further embodiment, the twisting of the digit lines comprises a modification of a complex twist. Sets of four digit lines are twisted about a point halfway between I/O switches, from inside to outside. In addition to the complex twist, pairs of global column decode lines are twisted about the same point. Further, the I/O switches which are located between the twisted global column decoder lines are coupled to outside ones of the twisted digit lines, and the I/O switches which are located outside the twisted global column decoder lines are coupled to inside ones of the complex twisted digit lines. In this manner, one global column decoder line provides access to four non-adjacent digit pairs which can then be routed with minimal capacitive coupling of the digit lines and very little added complexity. Testing time is significantly cut because there is only one combination of digit lines to test for each global column decoder. All four pairs of digit lines may be tested at the same time rather than individually testing each possible combination of two pairs. In addition, the output from all four pair of digit lines may be taken to I/O pins because of reduced capacitive coupling. Since all four digit lines may be taken from one array, die operating current may be reduced along with a reduction in size and circuit complexity associated with having to obtain data from a different array.

In a further embodiment, four successive adjacent sets of four digit lines are twisted and coupled to pairs of I/O lines as controlled by a pair of twisted column decode lines. The twisting of the digit lines and column decode lines is done about a center point of their run supported by a semiconductor substrate. The sets of digit lines each comprise an inside and outside pair run in parallel on a first side of the center point, and then twisted about the center point such that the inside and outside pairs are reversed. The first and fourth set of digit lines has inside pairs of digit lines coupled to I/O pairs, and the second and third sets of digit lines has outside pairs of digit lines coupled to I/O pairs such that each decode line controls coupling of four different, nonadjacent, digit line pairs to four different I/O pairs.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Figure 2:
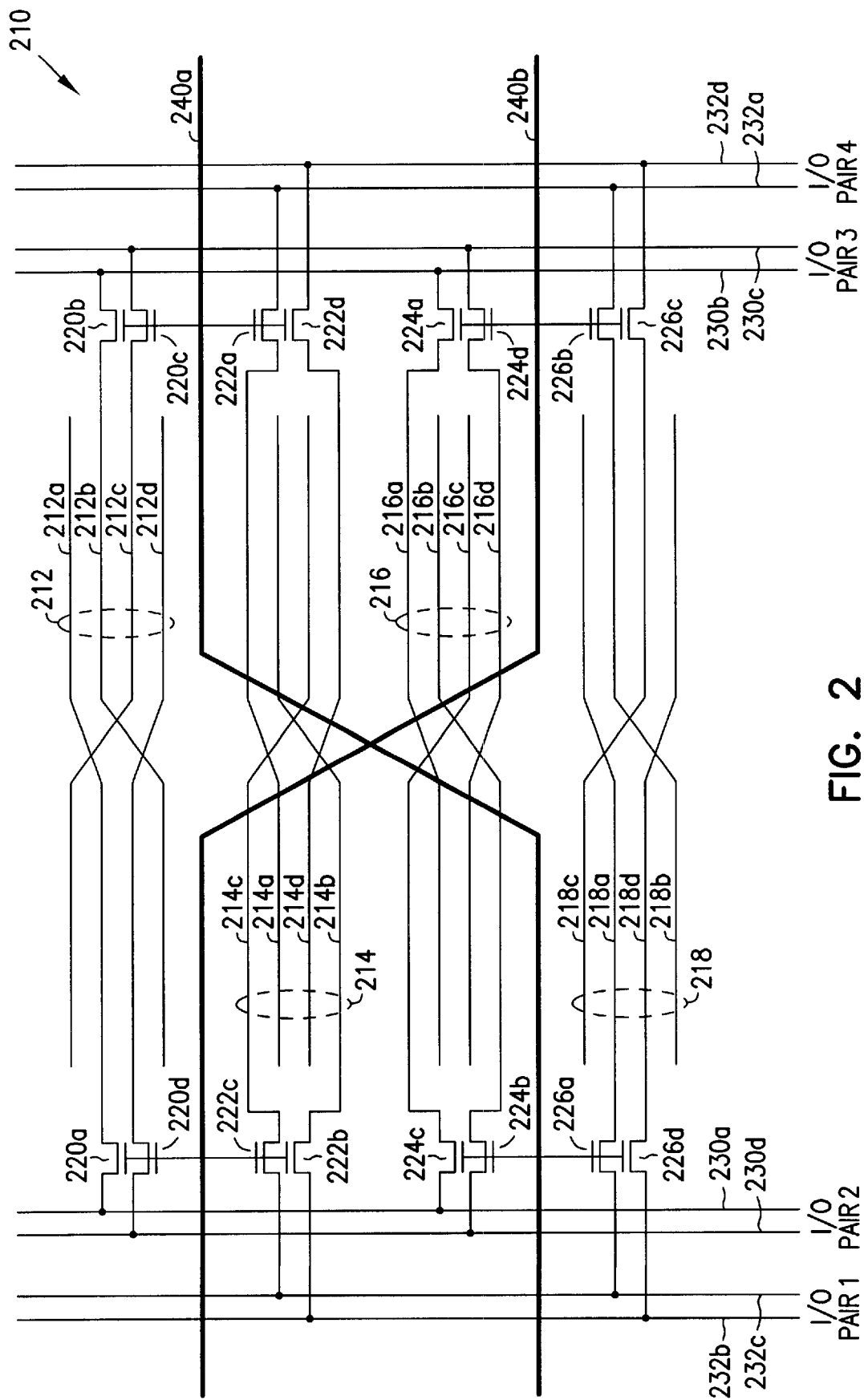
FIG. 2 is a block schematic diagram of a section of a memory device having twisted digit lines and a twisted pair of global column decode lines.

A section of a dynamic random access memory device supported on a semiconductor substrate is shown in FIG. 2 generally at 210. A first set of digit lines is indicated generally at 212, and each of four digit lines is represented at 212a, 212b, 212c and 212d. A second set of digit lines is indicated generally 214, and each of four digit lines is represented at 214a, 214b, 214c and 214d. A third set of digit lines is indicated generally at 216, and each of four digit lines is represented at 216a, 216b, 216c and 216d. A fourth set of digit lines is indicated generally at 218, and each of four digit lines is represented at 218a, 218b, 218c and 218d. The digit lines run substantially parallel to each other on a first side extending from a first end to the middle portion, then, following the twist, again run substantially parallel to each other on a second side from the middle portion to a second end. The sets themselves are also substantially parallel to each other and are successively laterally adjacent to each other to minimize die space consumption and optimize layout of digit line conductors. In one embodiment, at least two separate layers are used to form the digit line conductors to facilitate the twisting or crossover of the conductors. Each of the digit lines shown in FIG. 2 represent the memory cells, isolation gates and sense amplifiers among other circuitry that they are normally coupled to, which are formed in multiple layers within and on, and supported by the substrate. The digit lines are shown here in simplified block schematic form to more clearly show the invention. The digit lines are run across and are supported by a semiconductor substrate in a known manner.

Digit lines 212a, 212b, 212c and 212d are shown coupled through n channel transistors 220a, 220b, 220c and 220d respectively to respective lines 230a, 230b, 230c and 230d. Digit lines 214a, 214b, 214c, and 214d are shown coupled through n channel transistors 222a, 222b, 222c and 222d respectively to respective I/O lines 232a, 232b, 232c and 232d. I/O lines 230a, 230b, 230c and 230d are also coupled to n channel transistors 224c, 224a, 224b and 224d respectively. I/O lines 232a, 232b, 232c and 232d are also coupled to channel transistors 226b, 226d, 226a and 226c respectively.

A pair of global column decode lines 240a and 240b are coupled to the n channel transistors to selectively couple pairs of digit lines to pairs of I/O lines. Decode line 240a is coupled to gates of n channel transistors 220b, 220c, 222a, 222d, 224b, 224c, 226a, and 226d. Decode line 240b is coupled to gates of n channel transistors 220a, 220d, 222b, 222c, 224a, 224d, 226b, and 226c. The n channel transistors are sometimes referred to as y-gates, and are essentially switches used to control when the digit lines are coupled to I/O lines. Thus, the decode lines each turn on the n channel transistors they are coupled to when raised, connecting a pair of digit lines to each pair of I/O lines.

Figure 1:
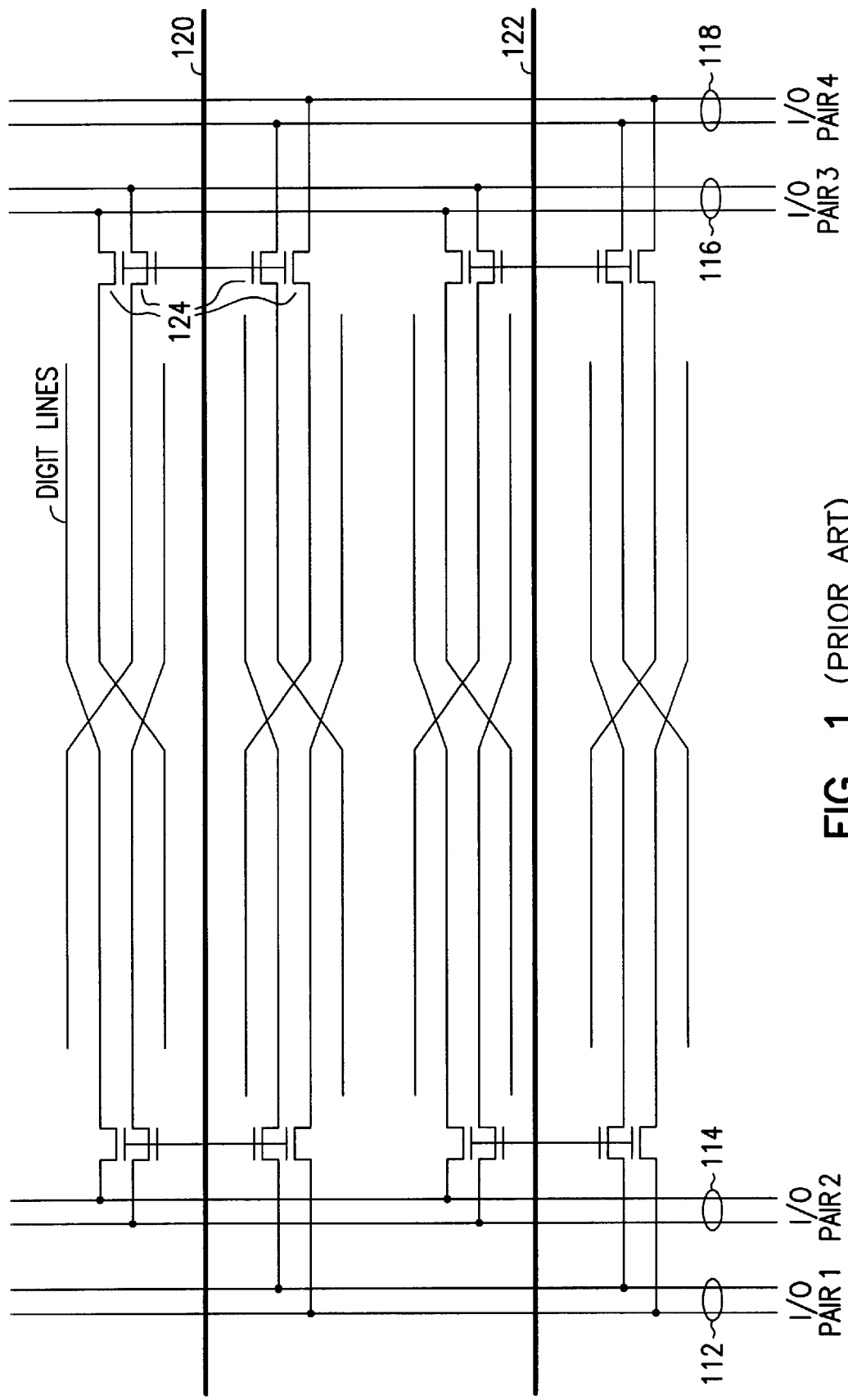
FIG. 1 is a block schematic diagram of a prior art memory device.

Each of the sets of digit lines are twisted about the center of their run using a new type of complex twist. The twists shown herein are merely schematic, and the actual layout of such twists will be subject to various design layout rules which may vary from device to device. In a normal complex twist of a set of four digit lines, four digit lines will be run in parallel, two on the outside and two on the inside. Halfway through the run in the middle portion, they will be twisted so that the outside two lines become the inside two lines, and the inside two lines from the first half of the run become the outside two lines of the second half of the run. In addition, one of the outside pair is actually crossed during the twist, while the other is not. While this provides advantages, the crossover is not required for the present invention. In prior complex twists, such as shown in FIG. 1, transistors are coupled to the inside lines on both sides of the run. The first and fourth sets of digit lines 212 and 218 are formed using a complex twist scheme. However, in the second and third sets of digit lines, the sense amplifiers are coupled to the outside sets of digit lines. This combination, along with the twisted decode lines 240a and 240b ensure that of the four digit line pairs that are accessed by raising one of the decode lines, no lines of one pair are adjacent to any lines of another pair. This means that all four pairs of I/O lines may be used in providing data since adverse digit to digit coupling effects are reduced.

Figure 3:
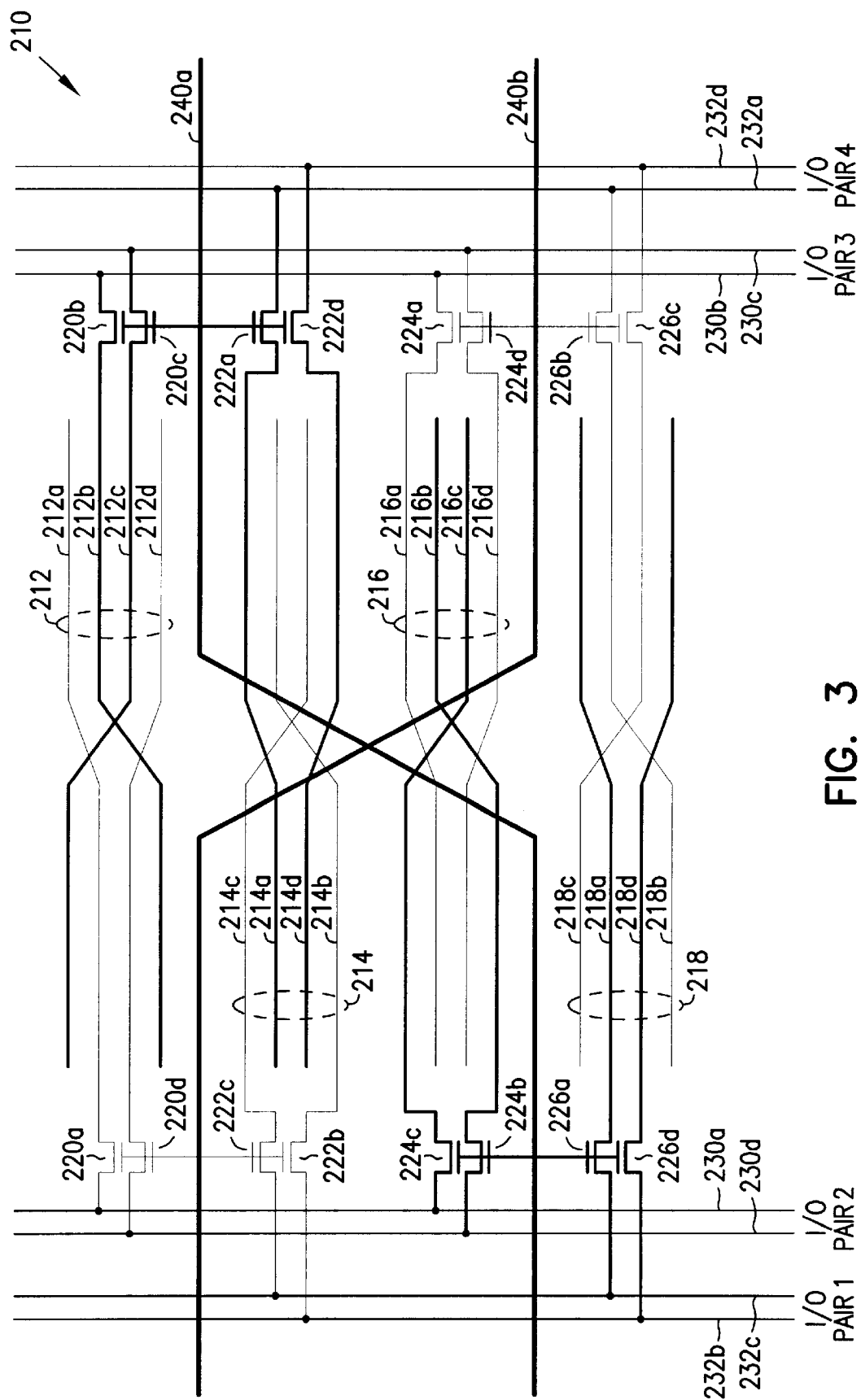
FIG. 3 is a block schematic diagram of the memory device of FIG. 2 with selected digit lines highlighted.

In FIG. 3, digit lines which are coupled to I/O pairs by raising column decode line 240a are darkened to more clearly illustrate the operation and benefits of the present invention. When raising column decode line 240a, n channel transistors 220b, 220c, 222a, 222d, 224b, 224c, 226a, and 226d become active, coupling pairs of digit lines 212b, 212c, 214a, 214d, 216b, 216c, 218a and 218d to pairs of I/O lines. Tracing back all the digit lines to both sides of their run as delineated by the twist, it can be seen that none of the lines in any pair are adjacent to lines of another pair for any part of that run.

FIG. 3 also more clearly illustrates that for the first half of the run of digit lines on a first side of the twist region, corresponding to the side that transistors 220a and 220d are on, the pairs of digit lines alternate from inside to outside in successive sets of digit lines. On the second half of the run, or the second side of the twist or halfway point of the run, the pairs of digit lines alternate from outside to inside in successive sets of digit lines.

As can also be seen in FIG. 3, several major changes from the standard complex twist scheme have been made. The column decode lines 240a and 240b have been twisted approximately in the middle of their run. This immediately has the result of involving more than two sets of digit lines. Now, four sets are involved, which increases the ability to find nonadjacent pairs of digit lines. To further help in obtaining nonadjacent pairs of digit lines, the coupling of sense amplifiers was modified. Now, four of the pair of sense amplifiers are coupled to outside digit line pairs as opposed to inside pairs in the standard complex twist. Further, the particular choice of which outside pairs to couple to sense amplifiers helps in obtaining nonadjacent pairs of digit lines.

Figure 4:
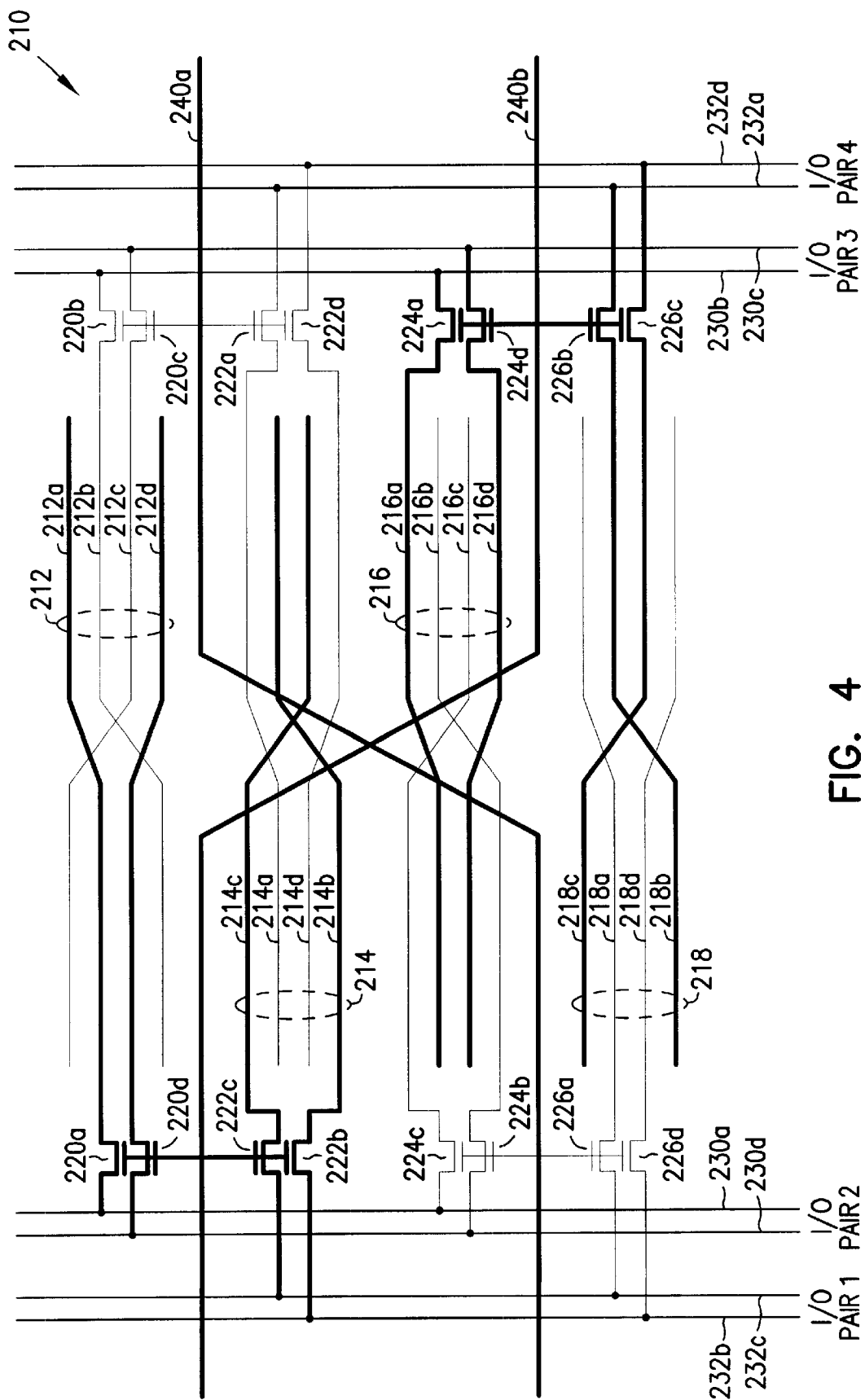
FIG. 4 is a block schematic diagram of the memory device of FIG. 2 with different selected digit lines highlighted.

In FIG. 4, digit lines which are coupled to I/O pairs by raising column decode line 240b are darkened to more clearly illustrate the operation and benefits of the present invention. When raising column decode line 240b, n channel transistors 220a, 220d, 222b, 222c, 224a, 224d, 226b, and 226c become active, coupling pairs of digit lines 212a, 212d, 214b, 214c, 216a, 216d, 218b and 218c to pairs of I/O lines. Tracing back all the digit lines to both sides of their run as delineated by the twist, it can be seen that none of the lines in any pair are adjacent to lines of another pair for any part of that run.

It is to be understood that the above description is intended to be illustrative, and not restrictive. Many other embodiments will be apparent to those of skill in the art upon reviewing the above description. For example, the transistors in the first and fourth sets of digit lines could be coupled to outside digit lines, while the transistors in the second and third sets of digit lines could be coupled to the inside pairs of digit lines without departing from the scope of the present invention.

What is claimed is:

1. A memory array comprising:
   at least four digit line pairs, wherein the at least four digit line pairs are non-adjacent; and
   at least one twisted global column decode line so as to provide access to the at least four digit line pairs.

2. The memory array of claim 1 further comprising a plurality of memory cells coupled to the digit line pairs.

3. The memory array of claim 1 further comprising a plurality of I/O switches coupled to the digit line pairs.

4. A memory array comprising:
   at least four digit line pairs, wherein the at least four digit line pairs are non-adjacent, wherein the at least four digit line pairs are routed to external pins so as to allow data from the at least four digit line pairs to be read or written contemporaneously; and
   at least one twisted global column decode line so as to provide access to the at least four digit line pairs.

5. The memory array of claim 4 further comprising a plurality of memory cells coupled to the digit line pairs.

6. The memory array of claim 4 further comprising a plurality of I/O switches coupled to the digit line pairs.

7. A memory array comprising:
   a plurality of memory cells having digit lines, wherein a pair of the digit lines are twisted from inside to outside so as to provide that digit lines from the plurality of memory cells are non-adjacent; and
   at least one twisted global column decode line so as to provide access to the digit lines.

8. The memory array of claim 7 further comprising a plurality of I/O switches coupled to the digit line pairs.

9. The memory array of claim 7 wherein the digit lines are routed to external pins for reading and writing data contemporaneously.

10. The memory array of claim 7 wherein the column decode line is twisted at the same point as that at which the pair of digit lines are twisted.

11. The memory array of claim 7 wherein the column decode line is twisted at the same point as that at which the pair of digit lines are twisted.

12. The memory array of claim 7 wherein the column decode line is twisted at the same point as that at which the pair of digit lines are twisted.

13. A memory array comprising:
   a plurality of memory cells having digit lines, wherein a pair of the digit lines are twisted from inside to outside so as to provide that digit lines from the plurality of memory cells are non-adjacent, wherein at least four digit line pairs are routed to external pins so as to allow data from the at least four digit line pairs to be read or written contemporaneously; and
   at least one twisted global column decode line so as to provide access to the digit lines.

14. The memory array of claim 13 further comprising a plurality of I/O switches coupled to the digit line pairs.

15. The memory array of claim 13 further including a pair of twisted global column decode lines so as to provide access to the digit lines.

16. The memory array of claim 15 wherein the column decode lines are twisted at the same point as that at which the pair of digit lines are twisted.

17. The memory array of claim 13 wherein the column decode line is twisted at the same point as that at which the pair of digit lines are twisted.

18. A memory array comprising:
   a plurality of memory cells having digit lines, wherein a pair of the digit lines are twisted using a complex twist from inside to outside so as to provide that digit lines from the plurality of memory cells are non-adjacent; and
   at least one twisted global column decode line so as to provide access to the digit lines.

19. The memory array of claim 18 wherein the at least one global column decode lines comprises at least one pair of global column decode lines.

20. The memory array of claim 19 wherein the column decode lines are twisted at the same point as that at which the pair of digit lines are twisted.

21. The memory array of claim 18 further comprising a plurality of I/O switches coupled to the digit line pairs.

22. A memory array comprising:
   a plurality of memory cells having digit lines, wherein a pair of the digit lines are twisted using a complex twist from inside to outside so as to provide that digit lines from the plurality of memory cells are non-adjacent, wherein at least four digit line pairs are routed to external pins so as to allow data from the at least four digit line pairs to be read or written contemporaneously; and
   at least one twisted global column decode line so as to provide access to the digit lines.

23. The memory array of claim 22 wherein the at least one global column decode lines comprises at least one pair of global column decode lines.

24. The memory array of claim 23 wherein the column decode lines are twisted at the same point as that at which the pair of digit lines are twisted.

25. The memory array of claim 22 further comprising a plurality of I/O switches coupled to the digit line pairs.

26. The memory array of claim 22 wherein the column decode line is twisted at the same point as that at which the pair of digit lines are twisted.

27. A memory array comprising:
   a plurality of I/O switches;
   a plurality of memory cells having digit lines, wherein a pair of the digit lines are twisted about a point halfway between the plurality of I/O switches from inside to outside so as to provide that digit lines from the plurality of memory cells are non-adjacent; and
   at least one twisted global column decode line so as to provide access to the digit lines.

28. The memory array of claim 27 wherein the digit lines are routed to external pins for reading and writing data contemporaneously.

29. A memory array comprising:
   a plurality of I/O switches;
   a plurality of memory cells having digit lines, wherein a pair of the digit lines are twisted about a point halfway between the plurality of I/O switches from inside to outside so as to provide that digit lines from the plurality of memory cells are non-adjacent, wherein at least four digit line pairs are routed to external pins so as to allow data from the at least four digit line pairs to be read or written contemporaneously; and at least one twisted global column decode line so as to provide access to the digit lines.

30. The memory array of claim 29 wherein the at least one global column decode lines comprises at least one pair of global column decode lines.

31. The memory array of claim 30 wherein the column decode lines are twisted at the same point as that at which the pair of digit lines are twisted.

32. The memory array of claim 29 wherein the column decode line is twisted at the same point as that at which the pair of digit lines are twisted.

* * * * *